United States Patent [19]

Jones

[11] 4,149,904
[45] Apr. 17, 1979

[54] METHOD FOR FORMING ION-IMPLANTED SELF-ALIGNED GATE STRUCTURE BY CONTROLLED ION SCATTERING

[75] Inventor: Robert K. Jones, Centerville, Ohio
[73] Assignee: NCR Corporation, Dayton, Ohio
[21] Appl. No.: 844,164
[22] Filed: Oct. 21, 1977
[51] Int. Cl.$^2$ .................... H01L 21/265; H01L 7/54
[52] U.S. Cl. ............................... 148/1.5; 357/23; 357/59; 357/91
[58] Field of Search ................. 29/571; 357/23, 91, 357/59; 148/1.5

[56] References Cited

U.S. PATENT DOCUMENTS

| | | | |
|---|---|---|---|
| 3,748,187 | 7/1973 | Aubuchon et al. | 148/1.5 |
| 3,808,058 | 4/1974 | Henning | 148/1.5 |
| 3,863,330 | 2/1975 | Kraybill et al. | 29/571 |
| 4,060,427 | 11/1977 | Barile et al. | 148/1.5 |

OTHER PUBLICATIONS

Dennard et al., ". . . Short-Channel FET Device," IBM-TDB, 18 (1976) 2743.
Poponiak et al, "Forming Dielectric Isolation," IBM-TDB, 20 (1977) 1405.
Fang et al., "Forming Double Diffused Regions", IBM-TDB, 14 (1972) 3363.
Grant et al. ". . . Lateral Spread . . . Ions . . . into Si" Radiation Effects, vol. 29 (1976) pp. 189-190.

*Primary Examiner*—L. Dewayne Rutledge
*Assistant Examiner*—Upendra Roy
*Attorney, Agent, or Firm*—J. T. Cavender; Lowell C. Bergstedt; Philip A. Dalton

[57] ABSTRACT

A method of manufacturing a silicon gate MIS device using ion implantation and controlled ion scattering to provide concurrent formation and automatic alignment of the gate structure and adjacent impurity regions. In a preferred embodiment, the process is for the gate structure and source and drain of silicon gate FETs. The layered gate constituents—typically oxide and silicon—are formed on a semiconductor wafer. A photoresist mask which is larger than the desired gate size is formed on the silicon and the silicon is etched to the predetermined gate size beneath the overhanging mask. The photoresist mask is then used during ion implantation of the source and drain to establish the lateral surface boundaries within which ions are implanted. These lateral surface boundaries are selected so that as the ions are driven into the substrate to the desired junction depth of the source and drain by lateral scattering, the source and drain are aligned with the silicon gate electrode.

18 Claims, 4 Drawing Figures

STEP 1 — DEPOSIT SILICON NITRIDE LAYER

STEP 2 — FORM ACTIVE AREA-DEFINING NITRIDE LAYER

STEP 3 — FORM FIELD OXIDE

STEP 4 — REMOVE SILICON NITRIDE

STEP 5 — FORM OXIDE LAYER

STEP 6 — FORM POLYSILICON LAYER

STEP 7 — FORM PR MASK

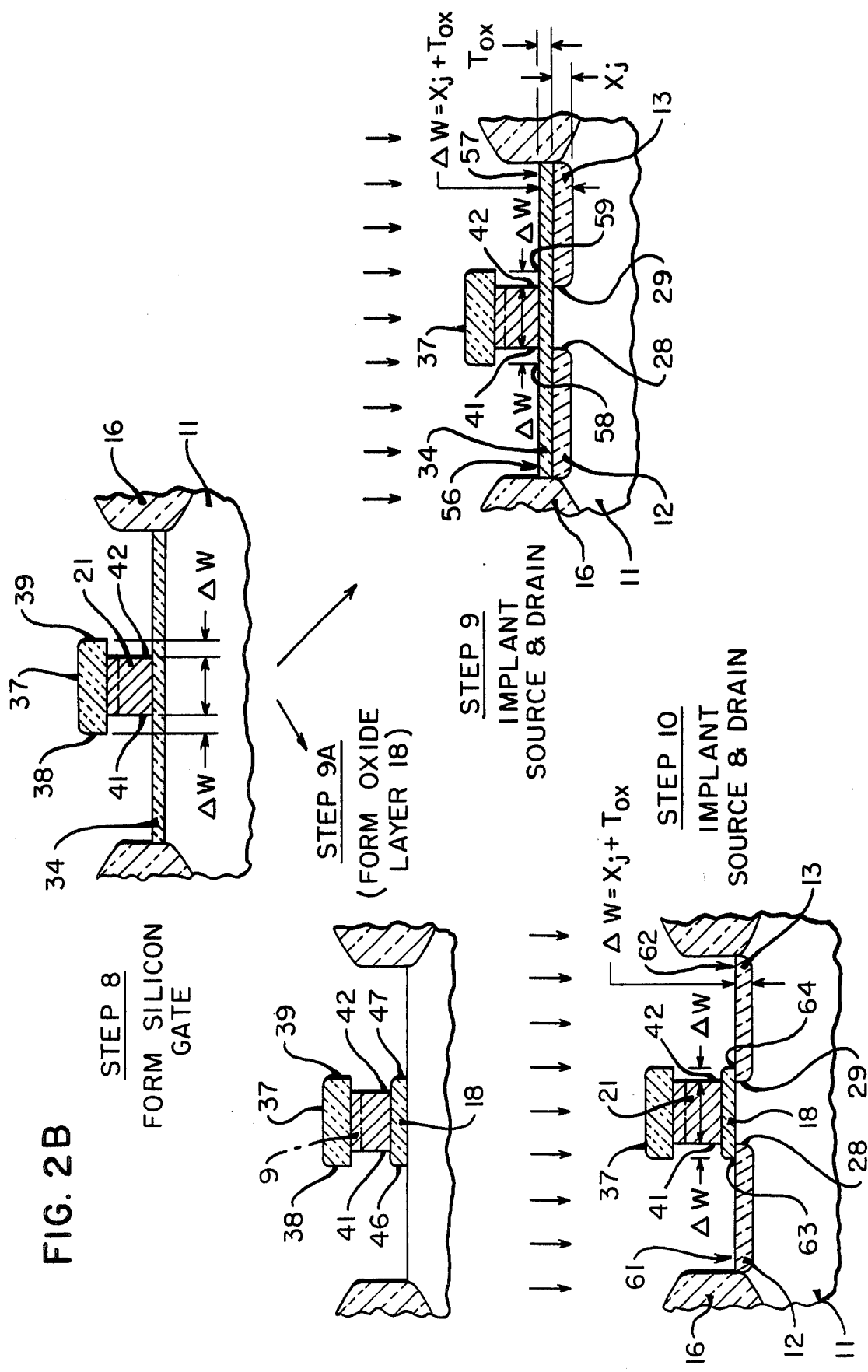

METHOD FOR FORMING ION-IMPLANTED SELF-ALIGNED GATE STRUCTURE BY CONTROLLED ION SCATTERING

CROSS-REFERENCE TO RELATED APPLICATION

The invention disclosed in the present application is related to that disclosed in the subject of U.S. Application Ser. No. 844,325 entitled PROCESS FOR MINIMUM OVERLAP SILICON GATE DEVICES, filed in the name of J. Cohen and P. C. Y. Chen on the same day as the present application, and assigned to the assignee of the present application.

BACKGROUND OF THE INVENTION

The invention relates to field effect devices and to silicon gate field effect devices. More particularly, the invention is directed to a process for forming a self-aligned, silicon-gate field effect device having minimum gate overlap capacitance.

A field effect transistor is a three electrode electronic device formed in semiconductor material such as a silicon wafer. The three electrodes are the source, gate and drain. The source and drain are formed in the silicon wafer, which is of predetermined, n or p, conductivity type by doping source and drain regions with impurities of the opposite conductivity type, i.e., p or n.

In the insulated gate field effect transistor (IGFET) technology widely used in the microelectronics industry, an insulating layer of material such as silicon dioxide (or insulating layers such as silicon dioxide and silicon nitride), the "gate insulator", is formed over the channel region between the source and drain, and the gate electrode is formed over the gate insulator. Application of suitable voltages to the gate, drain and source effect and/or control current flow from the source to the drain.

In a depletion mode transistor, a channel of the same polarity as the source and drain exists even without application of a gate voltage, i.e., for a gate voltage of zero. Conduction is normally at a maximum at zero gate voltage and is decreased or turned off by application of a suitable gate voltage. In contrast, enhancement mode transistors are normally off when the gate voltage is zero. When a suitable gate voltage is applied, the channel is inverted to the same conductivity type as the source and drain, thus providing a conduction path between the source and drain such that application of a suitable voltage to the drain causes current to flow from the source to the drain through the channel.

The small size of field effect transistors presents numerous problems, such as imprecise alignment of the gate structure with respect to the source and drain. Imprecise alignment results in excessive overlap of the gate structure relative to the source and drain and in parasitic capacitance. The speed of operation decreases with increases in the total capacitance between the gate and the substrate. Thus, the addition of parasitic capacitance decreases the speed of operation of the insulated gate field effect device. Furthermore, the thrust of the art of large scale integrated circuits is to shrink the sizes of silicon gate FETs in order to increase both the density of the circuits and the speed of operation of the FET devices. As the channel lengths are shortened, the parasitic capacitance due to overlap of gate electrode and source and drain regions becomes an increasingly significant factor in the speed of device operation and thus a limiting factor in increasing the speed of device operation.

U.S. Pat. No. 3,475,234 issued Oct. 28, 1969 to Kerwin et al. and U.S. Pat. No. 3,544,399 issued Dec. 1, 1970 to Dill, are directed to self-aligned silicon gate devices which presumably have reduced overlap. In the self-alignment process described in these patents, the gate insulator is first formed over the channel region, then a layer of silicon (typically polycrystalline silicon) is formed over the wafer. Apertures are formed in the silicon-insulator structure and source-and drain-forming impurities are deposited in the substrate through the apertures. The silicon (1) acts as a mask during the deposition step and prevents doping of the channel region during formation of the source and drain and (2) is itself doped, becoming a conductor suitable for use as the gate electrode. Since the silicon gate electrode is in situ during the formation of the source and drain, the source and drain are formed relatively precisely at the edges of the gate structure, at least in comparison to the alignment attainable with typical metal gate processes. This is because metal gates, usually aluminum, present degradation problems at the temperatures required for diffusion. Thus, the metal gate cannot be used as a mask during the formation of the source and drain, but must be formed subsequently in the fabrication process, with the concomitant problems of imprecise alignment.

U.S. Pat. No. 3,921,282 issued Nov. 25, 1975 to Cunningham et al. also uses the gate structure to mask the channel region. The Cunningham et al. process differs from those of Kerwin et al. and Dill in that the silicon gate electrode is formed after the source and drain regions and the field oxide are formed. Silicon oxide is formed over layers of oxide and nitride which cover the channel region and is used as the mask during formation of the source and drain. A thick layer of oxide is then formed on the wafer. The nitride is used as an oxidation barrier during this step, to prevent oxidation of the channel region. The result is a channel region well which is surrounded by the thick oxide layer. The nitride is then removed and the gate electrode can be deposited over the channel-covering oxide with relatively few alignment problems, because the well precisely defines the channel region between the source and drain, while the thick surrounding oxide reduces the effect if the silicon overlaps the source or drain.

The more precise alignments provided by the above silicon gate processes do not eliminate gate overlap capacitance, however. This is because diffusion is an isotropic process and in diffusing the impurities into the substrate to form the source and the drain, the impurities also diffuse laterally and tuck under the gate. The resulting overlap between the source and drain and the gate structure, of course, results in gate overlap capacitance.

As will be appreciated from the above, it is desirable to have a process for forming semiconductor devices which precisely aligns the gate structure with respect to source and drain regions, with minimum overlap.

SUMMARY OF THE INVENTION

The invention is an improvement of the process for forming minimum overlap silicon gate devices taught in NCR U.S. Application Ser. No. 844,325, and is a process for simultaneously forming and aligning a silicon electrode coincident with an adjacent impurity region in a stratified structure comprising a semiconductor substrate and a layer of silicon. The process comprises forming on the silicon a masking layer having a first boundary; forming from the silicon layer the silicon electrode having a second boundary spaced along the substrate from the first boundary; and doping the substrate by implanting impurities within the substrate to form the impurity region with an attendant boundary determined by the first boundary and aligned with the second boundary.

BRIEF DESCRIPTION OF THE DRAWING

FIGS. 2A and 2B are flow diagrams illustrating by sequential cross-sectional representation the process of the present invention for forming an insulated, self-aligned, minimum overlap silicon gate semiconductor device.

DETAILED DESCRIPTION

Figure 1:
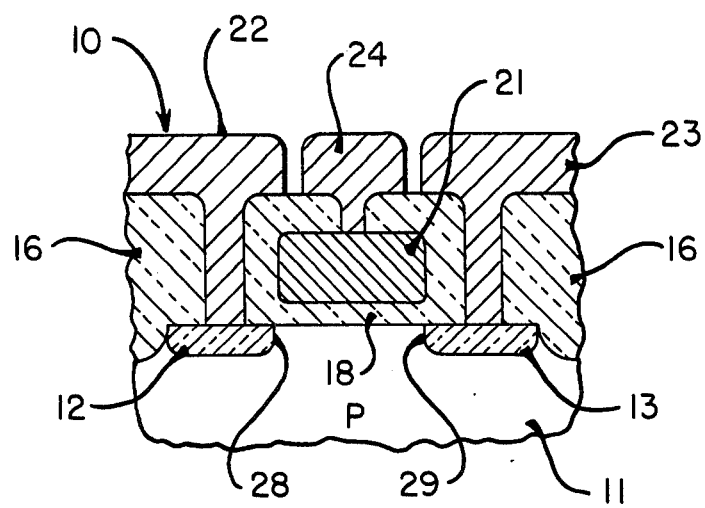
FIG. 1 is a cross-sectional view, taken parallel to the channel, of an insulated, self-aligned, non-overlapping silicon gate field effect transistor fabricated according to a process embodying the principles of the present invention.

Referring now to FIG. 1, there is shown a cross-sectional view taken parallel to the channel of a self-aligned silicon gate field effect transistor 10 embodying the principles of the present invention. Although the description is directed to the fabrication of the transistor 10, the description is exemplary of the fabrication of a class of devices which embody the principles of the present invention. Also, the process parameters are exemplary of alternatives which will be readily applied by those skilled in the art to implement the disclosed process.

The device 10 comprises a substrate 11 of one conductivity type, illustratively, P-type, within which spaced-apart surface-adjacent impurity regions of the opposite conductivity type form source 12 and drain 13. A thick layer 16 of dielectric, typically silicon oxide, is formed on the substrate 11 for isolating the device 10. A gate structure comprising silicon oxide gate insulation layer 18 and silicon gate electrode 21 overlies the channel region between the source 12 and drain 13. The gate structure is directly above and the opposite edges thereof are aligned with the source and drain inner edges 28 and 29 (the facing or adjacent inner edges of the junctions of the source and drain with the substrate), yet does not significantly overlap the source and drain. For purposes of illustration, electrical contacts 22 and 23, respectively, are shown connected to the source 12 and the drain 13 for applying bias voltages which, in cooperation with the gate voltage applied via electrical contact 24, control the conduction path and current across the channel region. Those skilled in the art will understand that electrical contact is usually made at a single point along each of a pair of diffusion stripes which provide the source and drain for a plurality of devices. Other insulating materials, passivating materials, and electrical connections and interconnections (not shown) may be applied as needed to complete the protection of and the integration of the transistor 10 with other components.

The thicknesses and other dimensions shown for device 10 are selected for clarity of illustration and are not to scale. Typical thicknesses are: source 12 and drain 13, about 2–2.5 microns for p-channel and 0.5–1.0 micron for n-channel; field oxide 16, about 1.5–2.0 microns; gate oxide 18, about 0.1 micron (1,000 Angstroms); silicon gate electrode 21, about 0.5 micron; source and drain contacts 22 and 23, about 4 microns; and gate contact 24, about 4 microns. Also, the gate structure length (measured along the longitudinal dimension of the channel between the source and drain parallel to the plane of the drawing) and width (measured laterally of the channel length perpendicular to the plane of the drawing) are typically about 3 microns by 10 microns. Generally, these exemplary dimensions can be made smaller or larger but the thrust of microelectronics technology is toward smaller dimensions to achieve greater device density, better performance, etc. In any event, it is obvious that meaningful scale representation of such widely varying dimensions is impossible within relatively small drawing space.

The present fabrication process is an improvement of the process described in U.S. Application Ser. No. 844,325, entitled PROCESS FOR MINIMUM OVERLAP SILICON GATE DEVICES, filed on even date in the name of J. Cohen and P. C. Y. Chen and assigned to the assignee of the present invention. Both processes provide a self-aligned structure in which the process of forming the gate structure 21 and the process of forming the source 12 and drain 13 are coordinated and use a novel masking technique to form the source and drain in precisely aligned, non-overlapping or minimum-overlapping relationship with respect to the gate structure.

Figure 2A:
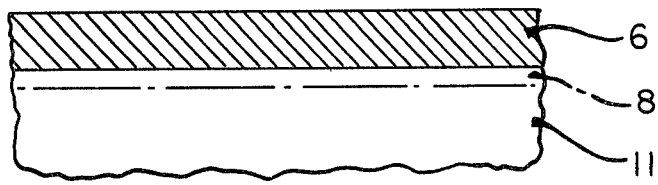
Figure 2A:
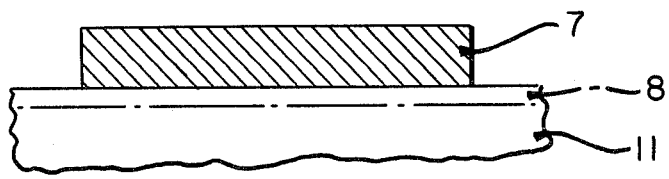
Figure 2A:
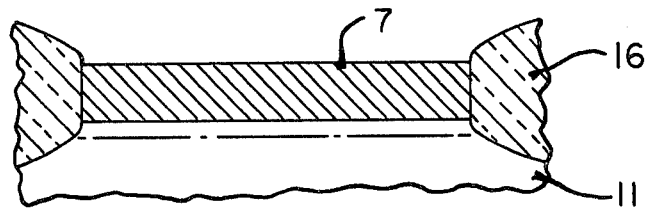
Figure 2A:
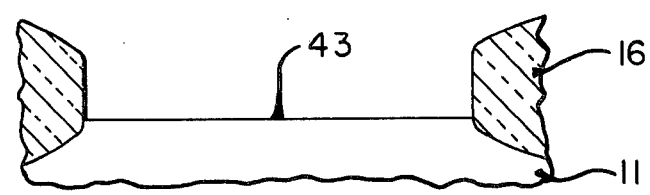
Figure 2A:
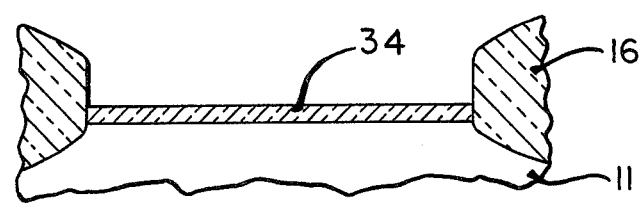
Figure 2A:
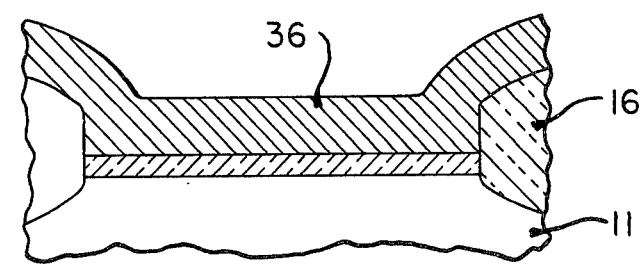
Figure 2A:
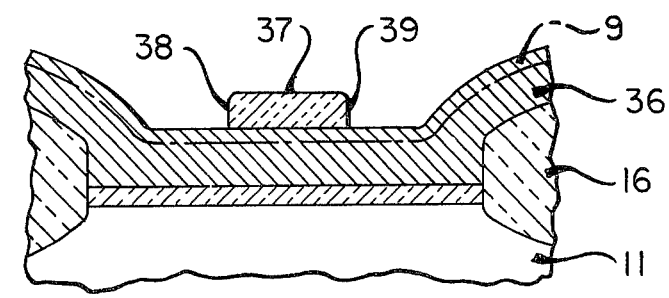

Referring to FIGS. 2A and 2B, the exemplary present process comprises: forming a layer of silicon nitride 6 on a semiconductor wafer 11 (step 1); selectively removing the silicon nitride layer to leave a layer 7 of active device area-defining silicon nitride which is approximately coextensive longitudinally and laterally of the substrate with the subsequent location and shape of the combined source, gate and drain (step 2); forming a thick oxide layer 16 on the substrate 11 about the sides of the nitride layer 7 (step 3); removing the silicon nitride layer 7 to leave the active device area 43 defined on the substrate by the oxide layer 16 (step 4); forming an oxide layer 34 in the active device area (step 5); forming a silicon layer 36 on the oxide layer 34 (step 6); forming a photoresist mask 37 over and extending longitudinally outside the gate region (step 7); overetching the silicon layer 36 under the mask 37 to form silicon gate electrode 21 overlying the channel region and having opposite edges 4 and 42 lying inside the opposite edges 38 and 39 of the mask (step 8); as an option, selectively forming the oxide layer 34 to the desired shape of the gate oxide 18; (step 9A); and, implanting impurities in the substrate to form source 12 and drain 13 (step 9 or 10). The position of the mask edges 38 and 39 and the implantation energy are selected to concurrently drive the impurites into the substrate to the desired source and drain junction depth $x_j$ so that by lateral scattering, the inner edges 28 and 29 of the source and drain are simultaneously formed in alignment with the opposite sides 41 and 42, respectively, of the gate electrode.

Referring further to FIGS. 2A and 2B and focusing upon the results of the crucial steps of the process, in a preferred embodiment, a photoresist mask 37 is formed on the previously formed silicon (step 7). The peripheral boundary or boundary of the mask 37 includes opposite longitudinal edges 38 and 39 which extend the distance $\Delta w = x_j$ (the depth in the substrate of the source-substrate junction and the drain-substrate junction) $+T_{ox}$ (the thickness of gate oxide layer 34) past the future positions of the opposite longitudinal edges 41 and 42 of the peripheral boundary or boundary of the subsequently formed gate electrode 21. Referring to FIG. 2B, the electrode 21 is then formed by overetching or otherwise undercutting the silicon layer 36 so that each of the opposite edges or sides 41 and 42 is recessed the distance $\Delta w$ beneath the mask edges 38 and 39, respectively (step 8).

In step 9, the source and drain are implanted by accelerating ions at a suitable energy to provide the $x_j$ desired and at a suitable dosage to provide the concentration desired. The ions enter the oxide layer 34 at areas 56 and 57 which are defined by the boundaries of the mask 37. That is, the areas 56 and 57 are outside the mask boundary on the opposite sides thereof and have inner edges 58 and 59, respectively, which are aligned with the opposite sides of the mask. Upon entering the oxide, the ions move (1) perpendicularly through the silicon oxide layer 34 and into the substrate 11 (at surface areas thereof which are determined by the mask boundaries), and (2) because of scattering, laterally along the plane of the oxide and the substrate, and (3) in all directions in between those of (1) and (2). As the result of this approximately isotropic scattering and the nearly equal velocities of the ions in silicon oxide and silicon media, upon entering the oxide layer 34 the ions will travel laterally and perpendicularly at approximately equal speeds. The ions thus traverse the lateral distance $\Delta w$ from the mask edges 38 and 39 (corresponding to the inner edges 58 and 59 of areas 56 and 57) to the gate edges 41 and 42 in the same amount of time required to cover the distance $\Delta w$ from the surface of the oxide layer 34 to the source-substrate junction and the drain-substrate junction at the depth $x_j$ beneath the substrate surface. Thus, by scattering, the source 12 and drain 13 are formed to the desired junction depth $x_j$ and with inner edges 28 and 29 coincident with the gate edges 41 and 42.

Alternatively to step 9, a portion of oxide layer 34 may be removed to leave gate oxide 18 having a peripheral boundary or boundary of which opposite longitudinal edges 46 and 47 are aligned with mask edges 38 and 39, or recessed beneath the mask. (In FIG. 2B, step 9A, edges 46 and 47 are shown coincident with mask edges 38 and 39 for purposes of illustration). The source and drain are then formed by ion implantation (step 10) in the manner of step 9. The substrate is bombarded by ions within surface areas which are again determined by the boundaries of the mask 37. Here, the substrate surface areas are indicated at 61 and 62 and correspond to the oxide surface areas 56 and 57, step 9. As discussed regarding step 9, scattering effects lateral ion movement to complement the drive-in movement perpendicular to the plane of the substrate and form the source and drain at the desired junction depth $x_j$ with the inner edges 28 and 29 coincident with gate edges 41 and 42. Note that here $T_{ox}=0$, and $\Delta w=x_j$. Accordingly, the dimensions of the mask 37 are made such that the overlap relative to gate electrode 21 is $\Delta w=x_j$ and the implantation energy is decreased to accomplish the desired drive-in and scatter for the lesser value $\Delta w=x_j$. It will be appreciated that the mask dimensions and ion acceleration energy can be varied to accommodate a wide range of oxide thicknesses, and that all or only a part of the thickness of the oxide layer 34 may be removed from areas 61 and 62.

Referring further to FIG. 2A, preparatory to the crucial mask formation, gate electrode formation and implantation steps, in step 1 the silicon nitride layer 6 is formed on the substrate 11 to a typical thickness of 1,500 Angstroms. Exemplary techniques for forming the nitride layer 6 include reacting ammonia, NH$_3$, and silane (silicane) SiH$_4$, in a reactor at approximately 800° C., or reacting ammonia and silicon tetrachloride, SiCl$_4$, in a furnace at approximately 900° C. Those skilled in the art will appreciate that the parameters such as temperature and thickness may be changed and that other processes may be employed for this and the other steps.

It may be desirable to grow a layer 8 of oxide (shown in phantom in FIG. 2A, step 1) on the substrate 11 to increase adhesion of the silicon nitride layer 6 to substrate materials such as silicon. The oxide layer 8 also acts as a barrier to prevent the formation of hard-to-etch compounds by the silicon nitride 6 and the silicon substrate 11. The silicon oxide layer 8 is typically about 1,000 Angstroms thick. One suitable technique is to steam grow the silicon oxide layer 8 at 975° C. Other techniques such as pyrolitic decomposition and plasma deposition will be readily applied by those skilled in the art.

In step 2, the nitride layer 6 is formed to the active device area-defining layer 7. One technique is to etch the layer 6 through a mask (not shown). The mask can be of a standard photoresist material, such as Waycoat, which is applied in solution to the nitride, spun to promote a uniform coating, and then dried. The resulting layer is exposed to ultraviolet light through a mask (not shown), developed in Waycoat developer to remove the exposed areas, and the developed image is hardened by baking. The resulting exposed nitride areas are removed by etching in hot phosphoric acid.

In step 3, the field oxide 16 is grown about the edges of the nitride layer 7 and to a thickness of about 1.5 microns (15,000 Angstroms). As is done in growing oxide layer 8, the field oxide can be steam grown at 975° C.

In step 4, the active area-defining nitride layer 7 is removed by etching in hot phosphoric acid. If the adherence-promoting oxide layer 8 is present, it is also removed by etching using an etchant such as a buffered, 7:1 mixture by volume of ammonium fluoride and hydrofluoric acid. At a temperature of 33° C. this mixture etches silicon oxide at about 1,500 Angstroms per minute and will etch through the 1,000 Angstrom thickness of silicon oxide layer 8 to the substrate 11 in less than one minute. Removal of the silicon nitride layer 7 or the nitride layer and the oxide layer 8 leaves the active region 43 defined within field oxide 16 on the surface of substrate 11.

In step 5, layer 34 of oxide is grown or deposited on the substrate 11 in the active region 43. Growing the oxide in a dry O$_2$ environment provides a good quality, relatively dense gate oxide; however, the aforementioned steam growth, pyrolitic decomposition, or plasma deposition techniques can be used. At 1,000° C. the exemplary dry O$_2$ growth forms the oxide layer to a sufficient thickness of about 0.1 micron (1,000 Angstroms) in about 150 minutes.

It may be desirable to dope the channel and/or the field regions of n-channel devices with p-type dopants to control the threshold voltage and eliminate parasitic field inversion. This doping is conveniently done prior to the formation of obstructing structures such as the gate electrode, e.g., after step 5 for the channel doping and after step 2 for the field doping.

The silicon layer 36 is formed on the silicon oxide surface in step 6 by a process such as the decomposition of silane. One suitable method employs the AMT Model 1200 reactor made by Applied Materials, 3050 Bowers Avenue, Santa Clara, Calif., and transports the silane in nitrogen carrier gas and decomposes the silane at 600°–700° C. for deposition on the underlying silicon oxide.

At least several other techniques such as deposition in a furnace tube, evaporation, pyrolitic decomposition of $SiCl_4$ and $H_2$, and cathodic sputtering can be used to form the silicon. It should be noted that the exemplary conditions are not suitable for the formation of single crystal silicon and the silicon will be formed in polycrystalline form, but that either single crystal or polycrystalline silicon can be utilized in the electrode 21.

Prior to formation of the photoresist mask in step 7, the upper surface of the silicon layer 36 can be converted to a layer 9 of silicon oxide (shown in phantom in FIG. 2A, step 7) or the silicon oxide can be deposited on the silicon upper surface. The silicon oxide layer 9 increases adhesion of the photoresist to the silicon and thus enhances the masking characteristics of the photoresist during etching. About 500-1500 Angstroms thickness of oxide is suitable for this purpose.

The gate photoresist mask 37 is formed on the silicon layer (or on the oxide layer 9) 36 in step 7. The peripheral boundary of the mask is formed so that opposite edges 38 and 39 thereof are each spaced (in their longitudinal positions along the length of the channel) the distance $\Delta w$ from the subsequently formed (step 8) edges 41 and 42 of the silicon gate electrode 21. The mask may be formed as described in step 2 using suitable conventional photolithographic techniques.

If the adherence-promoting oxide layer 9 is used, it should be removed outside the gate region prior to formation of the gate electrode 21, using the buffered mixture of hydrofluoric acid in ammonium fluoride.

In FIG. 2B step 8, the silicon layer 36 is etched about the mask 37 to form gate electrode 21. Etching is by a selective etchant, such as a mixture of hydrofluoric, nitric and acetic acids, which etches the silicon much faster than the adjacent material, here silicon oxide layer 18. Alternatively, the electrode 21 can be formed by plasma etching using $CF_4$ gas. The etchant is applied for a sufficiently long time to form the silicon gate electrode 21 to the desired peripheral boundary, including longitudinally opposite edges 41 and 42 which define gate length along the length of the channel.

Next, depending upon whether implantation is to be through the existing oxide layer 34, or is to be done directly into the substrate surface or into a reduced thickness oxide layer 34, one proceeds directly to the implantation step 9, or forms the gate oxide in accordance with step 9A before implanting pursuant to step 10. In the gate oxide-forming step 9A, the oxide layer 34 is formed to a gate oxide 18 having a peripheral boundary or boundary of which opposite longitudinal edges 46 and 47 are aligned with mask edges 38 and 39 (i.e., spaced $\Delta w$ from gate edges 41 and 42; this is the embodiment shown in FIG. 2B, step 9A) or recessed beneath the mask (not shown).

Etching, using a selective etchant such as the buffered mixture of hydrofluoric acid in ammonium fluoride can be used to form the gate oxide 18 recessed beneath the mask.

The gate oxide 18 can be formed coincident with the mask edges by selective etching of a mask-defined, ion-implanted oxide 34 or by ion milling or field-aided plasma techniques.

The selective, implantation controlled etching is accomplished using ion implantation to dope the oxide layer about the mask 37 outside the gate edges 46 and 47 with p-type dopant, such as boron, to a concentration of about $10^{19} cm^{-3}$. Then a selective etchant such as dilute hydrochloric acid is applied to etch the doped oxide more quickly than the undoped oxide. For example, dilute hydrochloric acid removes oxide having a $10^{19} cm^{-3}$ concentration of boron about five times faster than it removes undoped oxide. For the 1,000 Angstroms thick oxide layer 34, the hydrofluoric acid would overetch the oxide about 200 Angstroms beneath the mask.

Ion milling and field-aided plasma etching techniques are unidirectional. When applied in the presence of mask 37, these techniques form the oxide to the same shape, size, and location as the mask. A predetermined size, shape, and location can thus be transferred directly from the mask to the gate oxide 18. The point here is that gate oxide edges 46 and 47 are automatically formed in alignment with mask edges 38 and 39. Ion milling can be done using an ion-milling system to impinge argon ions normal to the oxide surface to eject atoms from the surface and thereby remove the surface. One suitable system is a Veeco Mirco Etch used with a VS 7760 pumping station, both available from Veeco Instruments, Inc., Terminal Drive, Plainview, N.Y. Field-aided plasma etching can be employed by applying an electric field normal to the surface to be etched to selectively direct the plasma ions of a $CF_4$ gas plasma in a commercial plasma etcher. One suitable etcher is model no. PFS/PDE/PDS-501, available from LFE Corporation, 1601 Trapelo Road, Waltham, Massachusetts.

Those skilled in the art will realize it may be desirable to implant impurities through an oxide layer such as the layer 34 (step 9) to minimize substrate surface crystal lattice damage. For this purpose, some of the thickness of the portions of oxide layer 34 outside gate oxide 18 may be left in place by an abbreviated step 9A. Alternatively, step 9A can be used to remove the entire thickness of oxide outside the gate region prior to implantation directly into the substrate, or oxide can be formed to the desired thickness over the substrate after complete removal pursuant to step 9A and the substrate then implanted through the oxide.

To implant the source and drain, the mask 37 (the mask 37 and oxide 18) is (are) used as a deposition mask to define the implanted areas 56 and 57 in the upper surface of the oxide layer 34 (step 9) or in areas 61 and 62 in the upper surface of substrate 11 (step 10). Implantation is nearly unidirectional. By positioning the bombardment system to direct the ions perpendicularly to the mask 37, the inner edges of the initial surface-implanted areas are precisely aligned with mask edges 41 and 42 as discussed above and scattering is used to obtain the desired lateral drive-in during drive-in normal to the surface.

Typical ion implantation procedure is to ionize a gas containing the implant species in a high vacuum ($10^{-6} - 10^{-7}$ torr is typical), then the resulting dopant ions are accelerated across an electric field of sufficient magnitude to implant the ions to the desired depth in a receiving medium such as substrate 11. The gas may be ionized in a first chamber, the wafer or substrate 11 held in a second chamber, and the dopant ions accelerated between the first chamber and the second chamber. A suitable implantation apparatus is the Model 200-2-0A2F by Varion/Extrion of Blackburn Industrial Park, Gloucester, Mass.

As an example of ion implantation according to step 9 or step 10, arsine, $AsH_3$, gas is ionized to $As^+$ at $10^{-6}$–$10^{-7}$ torr and the $As^+$ ions are subjected to an acceleration energy of 200 keV with a dose of about $10^{16}cm^{-2}$ to provide n-type source 12 and drain 13 of junction depth $x_j = 0.5$ micron and $10^{21}cm^{-3}$ concentration.

Obviously p-type and other n-type ions can be used to form the source and drain. The relatively heavy ions, such as the exemplary arsenic ions, and antimony ions, are relatively immobile at even the elevated temperatures used in semiconductor device fabrication. This characteristic permits greater control of the source and drain dimensions and location, because the heavy ions can be implanted to the desired final junction depth and alignment, which will be unaffected by subsequent processing.

When relatively light weight ions are implanted, it is desirable to tailor the initial junction depth achieved by implantation (and thereby the scatter-induced lateral drive-in) so that diffusion caused by subsequent high temperature processing will drive the ions to the desired junction depth $x_j$ and alignment. Of course the mask overhang is still determined by the junction depth $x_j$ and is $\Delta w = x_j + T_{ox}$.

The device 10 is completed to the form shown in FIG. 1 by removing the mask and oxide layer 9, forming additional insulation, as needed, over the source 12 and drain 13, etching contact openings through the insulation, and forming source, drain, and gate contacts 22, 23, and 24. The contacts 22, 23, and 24 are typically of a conducting metal such as aluminum. A passivating layer (not shown) of material such as silicon oxide and connections and interconnections (not shown) may also be applied to the device.

Figure 3:
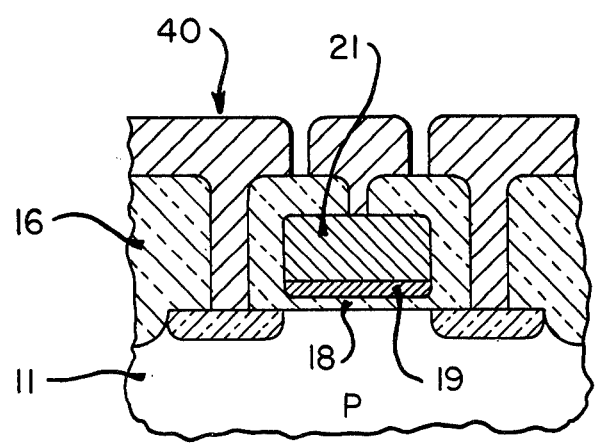
FIG. 3 is a cross-sectional view in the manner of FIG. 1 of another transistor device fabricated in the manner of the present invention.

The invention is not limited to formation of the exemplary silicon-oxide-semiconductor structure, but applies equally to gate structures or other projections of oxide, silicon, nitride, etc. which are adjacent one or more diffused regions. For example, the polysilicon could be replaced by any refractory metal to form an MOS (metal-oxide-semiconductor) structure. Also, the $SiO_2$ could be instead a composite of $Si_3N_4$ and $SiO_2$ or of $Al_2O_3$ and $SiO_2$. Furthermore, and referring to FIG. 3, a memory SNOSFET (silicon-nitride-oxide-semiconductor field effect transistor) or MNOSFET (metal-nitride-oxide-semiconductor field effect transistor) 40 having nitride layer 19 inserted between the gate oxide 18 and the gate electrode 21 may be formed using the process of the present invention. The SNOS and MNOS structures can be fabricated by forming the oxide layer in step 5; depositing a 500 Angstroms layer of nitride on the oxide after step 5; depositing the gate conductor layer 36 per step 6; performing steps 7 and 8; then, if desired, removing the nitride outside the gate region after step 8 using a selective etchant such as phosphoric acid.

If the SNOSFET or MNOSFET is to be a non-memory device, the gate oxide is formed sufficiently thick to prevent charge tunneling. For example, this could be done by forming oxide layer 34 to about 500 Angstroms in step 5. If the SNOSFET or MNOSFET is to be a memory device, the gate oxide is formed to about 10–60 Angstroms thickness. The structure and formation of memory devices, including the tri-gate memory device, is taught in U.S. Pat. No. 3,719,866 issued Mar. 6, 1973 to Charles T. Naber and George C. Lockwood.

Those skilled in the art will appreciate that when the gate electrode 21 is of silicon, the silicon is made conductive by doping during the formation of the semiconductor device. This doping can be done in the reactor used to form the silicon layer 36 and as part of step 6. Alternatively, it may be possible to remove mask 37 (and any oxide layer 9) prior to implantation and use the gate oxide as the implantation mask. This requires that the thickness of the gate oxide 18 (see FIG. 2B, step 10) be sufficiently greater than $T_{ox}$ (the thickness of the oxide, if any, over the source and drain) $+ x_j$ to preclude doping the substrate through the gate oxide and thereby extending the source and drain beneath the gate electrode 21. Assuming that this condition is satisfied, and that the mask 37 is removed and the gate oxide is used as the implantation mask, the silicon gate electrode 21 will be made conductive by doping during implantation of the source and drain. Of course, an additional conducting layer (not shown) can be applied to the electrode to enhance electrical contact.

The performance of the device 10 relative to that of prior art devices can be estimated as follows. First, the ratio of the capacitance, $C_{gn}$ ($1 = 1_n$), for the inventive device 10 to that of prior art devices, $C_{go}$ ($1 = 1_o$), is:

$$\frac{C_{gn}}{C_{go}} = \frac{(L_{eff} + 2l_n)}{(L_{eff} + 2l_o)}, \quad (1)$$

where $L_{eff}$ = minimum effective gate length, i.e., channel length and
$1$ = length of overlap between the gate insulator and the source or drain.

Assuming that the prior art overlap $1_o$ is equal to $x_j$, which approximates both the junction depth and the lateral distance of movement during lateral drive-in, and that the overlap, $1_n$, of device 10 is $\approx 0$, $$C_{gn} \approx \frac{L_{eff}}{L_{eff} + 2x_j} C_{go}. \quad (2)$$

Then, for the typical values $x_j = 0.5$–1 micron and $L_{eff} = 4$ microns, $C_{gn} \approx 0.80 C_{go}$ to 0.67 $C_{go}$. The device 10 is thus seen to decrease gate capacitance by about one-fifth to one-third.

The ratio of the time delay for device 10, $t_{dn}$, to that for prior art devices, $t_{do}$, is approximately:

$$\frac{t_{dn}}{t_{do}} \approx \frac{C_{gn}(l + M_n)}{C_{go}(l + M_o)}, \quad (3)$$

and $t_{dn} \approx (0.73$–$0.57)t_{do}$, where $M_n$ = Miller coefficient of the device 10, indicating the feedback capacity of the device, $\approx 0$,
$X_j = 0.5$–1 micron, $L_{eff} = 4$ microns, $M_o \approx \frac{x_j}{L_{eff} + 2x_j} \approx 0.10$–$0.167$, and $C_{gn}/C_{go} \approx 0.80$—$0.67$, from (2)

In short, in typical applications where $x_j \approx 1$ micron, the device 10 embodying the present invention can be expected to decrease gate capacitance by about one-third ($C_{gn} \approx 0.67\ C_{go}$) and to decrease the operating time delay by nearly one-half ($t_{dn} \approx 0.57\ t_{do}$).

Thus, there has been described a process for forming a self-aligned, non-overlapping silicon gate device and an exemplary embodiment for forming a silicon gate FET. Other alternative embodiments and changes in scope and detail within the scope and spirit of the invention will be readily devised by those skilled in the art. For example, the invention is applicable in general to the fabrication of projections of oxide, silicon, etc. which are adjacent one or more diffused regions. Also, fabrication parameters such as etchants and etch times and temperatures will be readily changed by those skilled in the art.

Having described preferred and alternative embodiments of the invention, what is claimed is:

1. In a process for forming a silicon electrode over and laterally adjacent an impurity region in a substrate, the silicon electrode being formed from a layer of silicon formed on the substrate, the improvement wherein the boundary of the substrate impurity region is automatically aligned with the boundary of the silicon electrode by the process of forming the substrate impurity region and the silicon electrode, and comprising:

forming on the silicon layer a mask having a first boundary;

forming the silicon layer into the silicon electrode having a second boundary spaced along the substrate from the first boundary and located beneath the mask; and implanting impurities within the substrate to form the impurity region to a given junction depth and with a boundary determined by the mask first boundary and aligned with the second boundary of the overlying silicon electrode by scattering.

2. The process of claim 1 wherein the impurities are p-type.

3. The process of claim 1 wherein the impurities are n-type.

4. The process of claim 3 wherein the impurities are selected from arsenic and antimony.

5. The process of claim 1 wherein an oxide layer is between the substrate and the silicon layer and wherein:

after forming the silicon electrode the oxide layer is formed to have a boundary recessed beneath the mask or aligned with the mask first boundary; and wherein the first and second boundaries are spaced apart the distance $\Delta w = x_j + T_{ox}$, where $x_j$ is the junction depth of the impurity region and $T_{ox} \geq 0$ is the thickness of the oxide layer in the region overlying the impurity region.

6. The process of claim 5, wherein a liquid bath etchant is applied to the oxide layer in the presence of the mask to overetch the oxide layer beneath the mask and form the oxide boundary recessed beneath the mask.

7. The process of claim 5, wherein the oxide is formed using a field-aided plasma etchant in the presence of the mask to remove at least part of the thickness of the oxide layer outside the first boundary.

8. The process of claim 5 wherein the oxide is formed by ion milling thereof in the presence of the masking layer to remove at least part of the thickness of the oxide layer outside the first boundary.

9. The process of claim 1, further comprising:

forming an oxide layer to the thickness $T_{ox}$ on the substrate over the impurity region prior to the implanting step; and implanting the substrate through the oxide layer; and wherein the first and second boundaries are spaced apart the distance, $\Delta w = x_j + T_{ox}$ where $x_j$ is the junction depth of the impurity region.

10. In a process for forming, in a composite comprising a semiconductor body, a layer of silicon and an interposed layer of oxide, a field effect transistor having a silicon electrode overlying a channel region of the semiconductor body between a source and a drain of junction depth $x_j$, the improvement comprising:

selectively forming the silicon layer to a gate electrode configuration having opposite edges spaced apart a predetermined distance along the channel region;

selectively forming the oxide layer to opposite edge boundaries up to a predetermined distance $\Delta w$ past each opposite electrode edge along the channel by removing as required at least a portion of the thickness of the oxide layer outside the positions of the opposite oxide edge boundaries to leave an oxide of thickness $T_{ox}$ outside the opposite oxide edge boundaries; and doping the substrate by ion implantation in the presence of a masking structure which extends the predetermined distance $\Delta w$ past each opposite electrode edge, where $\Delta w = x_j + T_{ox}$, to form a source and drain of junction depth $x_j$ and, by scattering, to form the source and drain aligned with the opposite edges of the gate electrode.

11. An improved process for forming a field effect transistor having a gate structure overlying a channel region of a semiconductor body intermediate a source and a drain of junction depth $x_j$, the gate region, source and drain defining the active area of the transistor, the improvement wherein the gate structure is formed aligned with adjacent inner edges of the source and drain by the process of forming the source and drain, comprising:

forming, in order, a silicon oxide layer over at least the active region of the semiconductor body and a silicon layer over at least the channel region of the semiconductor body;

forming a mask on the silicon layer having a first peripheral boundary, opposite sides of the first peripheral boundary being within source and drain regions of the substrate;

selectively removing the silicon layer in the presence of the mask to undercut the silicon layer beneath the mask and form a silicon gate electrode having a second peripheral boundary having opposite sides aligned with inner sides of the source and drain regions, and leaving the mask structure extending a predetermined distance $\Delta w$ past each of the opposite sides of the silicon gate electrode;

as required, selectively removing the oxide layer in the presence of the mask structure to form opposite side boundaries in the oxide beneath the mask structure by removing at least a part of the thickness of the oxide outside the opposite boundaries, thereby leaving oxide of thickness $T_{ox}$ outside the opposite oxide boundaries;

the predetermined distance the mask extends past the opposite sides of the silicon gate electrode being $\Delta w = x_j + T_{ox}$; and doping the substrate in the presence of the mask structure by ion implantation to form the source and drain of junction depth $x_j$ and, by scattering, to thereby form the inner edges of the source and drain aligned with the adjacent inner edges of the gate electrode.

12. The process of claim 11 wherein the oxide is formed by applying a liquid bath etchant to the oxide layer for a sufficient time in the presence of the mask to overetch the oxide layer beneath the mask and form the opposite side boundaries of the oxide within the opposite sides of the mask.

13. The process of claim 11 wherein field-aided plasma is applied to the oxide in the presence of the mask to form the opposite side boundaries of the oxide aligned with the opposite sides of the mask.

14. The process of claim 11 wherein ion milling is applied in the presence of the mask structure to form the opposite side boundaries of the oxide aligned with the opposite sides of the mask.

15. The process of claim 11 wherein the ions are p-type.

16. The process of claim 11 wherein the ions are n-type.

17. The process of claim 16 wherein the ions are selected from arsenic and antimony.

18. The process of claim 11 wherein:
$0.5 \text{ microns} \leq x_j$.

* * * * *

UNITED STATES PATENT OFFICE
CERTIFICATE OF CORRECTION

Patent No. 4,149,904　　　　　Dated April 17, 1979

Inventor(s) Robert K. Jones

It is certified that error appears in the above-identified patent and that said Letters Patent are hereby corrected as shown below:

Column 12, Claim 10, line 17, after "boundaries" insert -- extending -- .

Signed and Sealed this

Thirty-first Day of July 1979

[SEAL]

Attest:

LUTRELLE F. PARKER
Attesting Officer　　Acting Commissioner of Patents and Trademarks